(12) United States Patent
Hu et al.

(10) Patent No.: US 8,916,413 B2
(45) Date of Patent: Dec. 23, 2014

(54) PHASE CHANGE MEMORY AND MANUFACTURING METHOD THEREFOR

(71) Applicants: Semiconductor Manufacturing International Corporation, Shanghai (CN); Semiconductor Manufacturing International Corporation, Beijing (CN)

(72) Inventors: Minda Hu, Shanghai (CN); James Hong, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 57 days.

(21) Appl. No.: 13/656,370

(22) Filed: Oct. 19, 2012

(65) Prior Publication Data

US 2013/0099193 A1   Apr. 25, 2013

(30) Foreign Application Priority Data

Oct. 21, 2011   (CN) .......................... 2011 1 0322547

(51) Int. Cl.
*H01L 21/00* (2006.01)
*H01L 21/20* (2006.01)

(52) U.S. Cl.
USPC ........................................... 438/95; 438/381

(58) Field of Classification Search
USPC .............. 438/95, 381; 257/E31.027, E31.029
See application file for complete search history.

(56) References Cited

U.S. PATENT DOCUMENTS

| | | | | |
|---|---|---|---|---|
| 8,148,193 | B2 * | 4/2012 | Park et al. | 438/95 |
| 8,148,710 | B2 * | 4/2012 | Choi et al. | 257/4 |
| 8,399,285 | B2 * | 3/2013 | Chang | 438/95 |
| 2007/0138595 | A1 | 6/2007 | Hsu et al. | |
| 2008/0111121 | A1 | 5/2008 | Jang et al. | |

FOREIGN PATENT DOCUMENTS

| | | |
|---|---|---|
| CN | 1790726 A | 6/2006 |
| CN | 101241925 A | 8/2008 |
| KR | 1020090067818 A | 6/2009 |

* cited by examiner

*Primary Examiner* — Hung Vu
(74) *Attorney, Agent, or Firm* — Innovation Counsel LLP

(57) ABSTRACT

The present invention discloses a phase change memory and a manufacturing method thereof. The phase change memory according to the present invention uses top electrodes provided on the top of storage nodes to heat the storage nodes such that a phase change layer in the storage nodes undergoes a phase change. In the phase change memory of embodiments of the present invention, the contact area between the top electrode and the storage node is relatively small, which is good for phase change. Moreover, each column of storage nodes is connected by the same linear top electrode, which can improve photo alignment shift margin.

20 Claims, 6 Drawing Sheets

PHASE CHANGE MEMORY AND MANUFACTURING METHOD THEREFOR

CROSS-REFERENCE TO RELATED APPLICATIONS

This application claims priority to Chinese Patent Application No. 201110322547.X, filed on Oct. 21, 2011 and entitled "Phase Change Memory and Manufacturing Method thereof", which is incorporated herein by reference in its entirety.

FIELD OF THE INVENTION

Embodiments of the present invention relate generally to semiconductor devices and manufacturing methods therefor, and more specifically relate to a phase change memory and manufacturing methods therefor.

DESCRIPTION OF THE RELATED ART

Phase change memory (also abbreviated as PCM, PRAM or PCRAM) is an emerging technology for non-volatile computer memory. In the future, the PCM may replace the flash, because it is not only much quicker than the flash and easier to shrink to a smaller size, but it also has better recovery properties and can currently endure around 100 million write cycles.

A PCM memory unit is typically a tiny particle of chalcogenide alloy, which can quickly transform from an ordered crystalline state (with a low resistance) into a disordered amorphous state (with a much higher resistance) when it is heated, such as by an electric pulse. The same material is also widely applied to active coatings of various re-writable optical media, such as CDs and DVDs. The repeatable transformation process from a crystalline state to an amorphous state is triggered by a melting and quickly cooling mechanism (or a slower process called re-crystallization). GST (germanium, stibium and tellurium) is one of the currently-known PCM materials that has the most promising application prospects, with a melting point ranging from 500° C. to 600° C.

The crystalline and amorphous states of these alloy materials have different electrical resistivity, which can be used to store binary data. The amorphous, high resistance state represents a binary 0, while the crystalline, low resistance state represents a binary 1. The latest PCM designs and materials can realize several different values, for example, having 16 crystalline states rather than two states. Each of these states has different electrical properties, allowing a single memory unit to represent several bits and thus to significantly enhance storage density. This represents an improvement over current flash memory.

FIG. 1 shows a structural diagram of a conventional phase change memory.

As shown in FIG. 1, the phase change memory comprises word lines 101, diodes 103, contacts 105 and bit lines 107. There are word-line gaps 102 between the word lines 101. There are bit-line gaps 106 between the bit lines 107. And there are unit gaps 104 between the phase change memory units. Each word line 101 connects one row of phase change memory units, and each bit line 107 connects one column of phase change memory units. A storage node is generally provided between a contact 105 and a bit line 107.

FIG. 2 further shows a diagram of a partial structure of the phase change memory of FIG. 1.

As shown in FIG. 2, bottom electrodes 109 and phase change layers 108 are provided between contacts 105 and bit lines 107. In order to make the contact area between a bottom electrode 109 and a phase change layer 108 as small as possible, the bottom electrode 109 can be of a pillar shape or a slice shape. The bottom electrodes 109 shown in FIG. 2 are pillar electrodes, also referred to as lance structures.

The current phase change memory requires a complex fabrication process. Thus, it is desirable to provide a phase change memory that has a new structure with a simplified fabrication process.

SUMMARY OF THE INVENTION

An object of the present invention is to provide a phase change memory unit.

Another object of the present invention is to provide a phase change memory array.

A further object of the present invention is to provide a method for manufacturing a phase change memory.

According to a first aspect of the present invention, there is provided a phase change memory unit, comprising: a plurality of storage nodes each including a phase change layer; and a top electrode provided on the storage nodes, with one end of the top electrode being electrically connected to the storage nodes and an opposite end of the top electrode being electrically coupled to a bit line, wherein when a current is applied to the top electrode, the top electrode is configured to heat the storage nodes such that the respective phase change layers each undergo a phase change.

The storage nodes can each be connected to a word line via a diode.

The top electrode can comprise a metal.

The top electrode can comprise Ti or TiN.

The phase change layer can include a GST (germanium, stibium and tellurium) material.

The top electrode can contact upper surfaces of the storage nodes, and an area of contact between the top electrode and the respective upper surface of each storage node can be smaller than the respective upper surface of each storage node.

According to a second aspect of the present invention, there is provided a phase change memory array comprising a plurality of the aforementioned phase change memory units, wherein the phase change memory units of the plurality of phase change memory units are arranged in at least one column, and the top electrode is in electrical communication with each storage node of the at least one column.

According to a third aspect of the present invention, there is provided a method of manufacturing a phase change memory, comprising: providing a substrate with a plurality of through holes, wherein, storage nodes each including a phase change layer are formed in the through holes; forming a top electrode on each storage node such that one end of the top electrode is electrically connected to more than one of the corresponding storage nodes, wherein the top electrode is configured to heat the corresponding electrically connected storage nodes such that their phase change layers undergo a phase change; and, forming bit lines on the top electrodes such that another end of the top electrode is electrically coupled to a corresponding bit line.

The storage nodes can be arranged in at least one column, and the top electrode can be electrically connected to each of the storage nodes of the at least one column.

The forming a top electrode may further comprise: by taking every two columns of storage nodes as one group, forming a single strip of material between a first column and a second column of each group, wherein the strip at least partially overlaps each of the storage nodes in the respective group, each strip comprising a first sidewall and a second sidewall that are positioned opposite to each other, the first sidewall being located on the respective first column and the second sidewall being located on the respective second column; and, forming a first top electrode on the first sidewall and a second top electrode on the second sidewall.

The forming a single strip can further comprise: forming a first film layer on the substrate; forming a second film layer on the first film layer; forming a first mask on the second film layer, wherein, a position of the first mask corresponds to a position of the strip; etching the first film layer and the second film layer; and, removing the first mask.

The first film layer can comprise a dielectric material, such as an oxide.

The first mask can comprise a photo-resist.

The second film layer can comprise a hard mask layer.

The hard mask layer can comprise a nitride.

The forming a first top electrode on the first sidewall and a second top electrode on the second sidewall can further comprise: after the forming a single strip, forming a third film layer on the substrate, so as to cover a surface of the strip, the first sidewall, the second sidewall and a surface of the substrate; and etching the third film layer to remove a portion of the third film layer that covers the surface of the strip and the surface of the substrate.

The third film layer can comprise a conductive material such as a metal material.

The third film layer can comprise Ti or TiN.

The forming a first top electrode on the first sidewall and a second top electrode on the second sidewall can further comprise: forming a sixth film layer on the substrate, so as to cover a surface of the substrate, a surface of the strip and surfaces of the first top electrode and the second top electrode; performing a chemical mechanical planarization processing on the substrate using the second film layer as a stop layer; and, removing ends of the strip such that the first top electrode and the second top electrode are electrically disconnected from each other.

The removing ends of the strip can further comprise: etching the sixth film layer, the second film layer and the third film layer.

The forming bit lines may further comprise: after the removing ends of the strip, forming a fourth film layer and a fifth film layer in order on the substrate; forming a first trench and a second trench in the fourth film layer and the fifth film layer, the first and second trenches formed in positions that correspond to the first top electrode and the second top electrode respectively; and filling a conductive material into the first trench and the second trench, so as to form the bit lines.

The fourth film layer can comprise a nitride.

The fifth film layer can comprise an oxide.

The sixth film layer can comprise a dielectric material.

The forming a top electrode may further comprise forming the top electrode so as to contact upper surfaces of the more than one of the storage nodes, and an area of contact between the top electrode and the respective upper surface of each storage node may be smaller than the respective upper surface of each storage node.

An advantage of the present invention is to provide a new phase change memory.

Further features of the present invention and advantages thereof will become apparent from the following detailed description of exemplary embodiments according to the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

With reference to the drawings, the present invention can be more clearly understood based on the following detailed description. In the figures.

DESCRIPTION OF THE EMBODIMENTS

Figure 1:
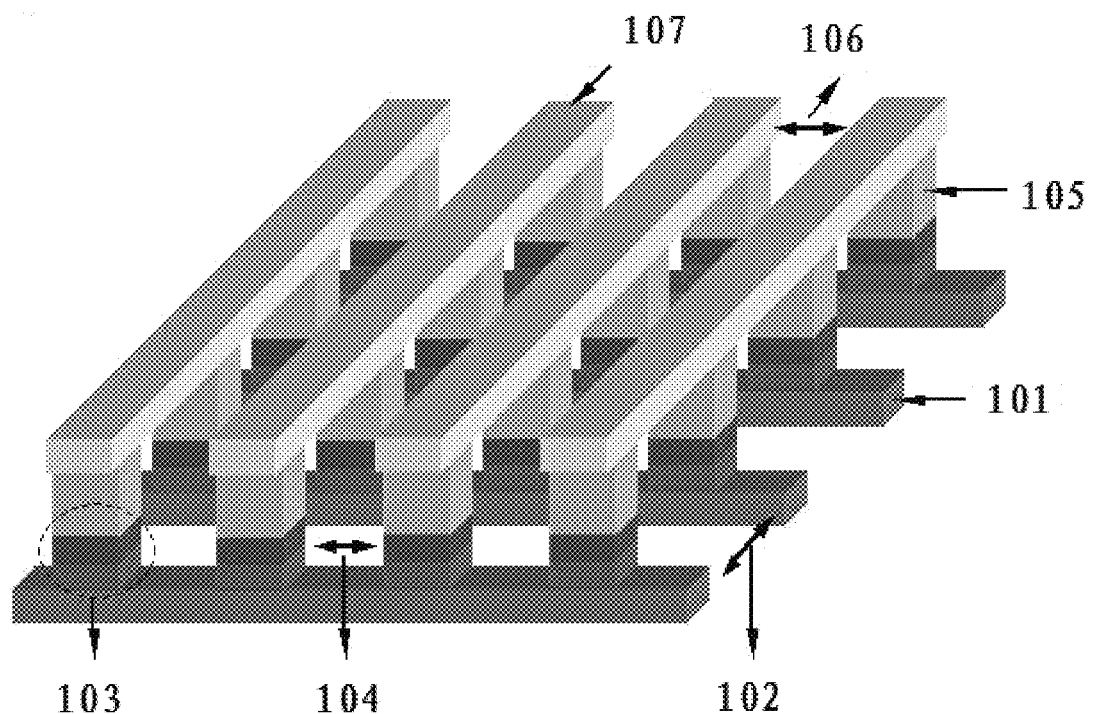
FIG. 1 is a diagram showing a structure of a conventional phase change memory.
Figure 2:
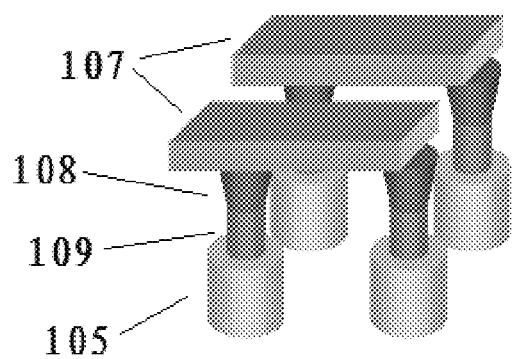
FIG. 2 is a diagram showing further details of part of the structure of the phase change memory of FIG. 1.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

Meanwhile, it should be understood that, for the convenience of description, each component in the figures has not been necessarily drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be approximate, illustrative only, and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Figure 3:
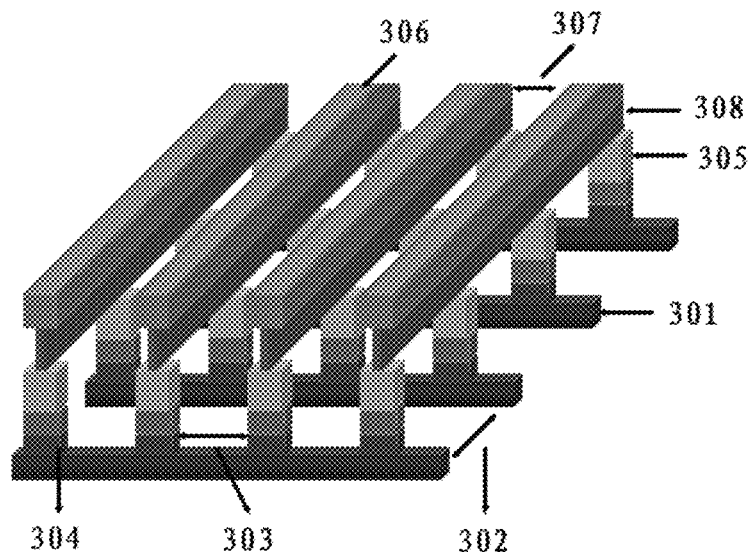
FIG. 3 is a diagram showing a structure of a phase change memory according to an embodiment of the present invention.

FIG. 3 is a diagram showing a structure of a phase change memory according to the present invention.

As shown in FIG. 3, the phase change memory comprises: word lines 301, diodes 304, storage nodes 305, top electrodes 308 and bit lines 306. Word lines 301 are spaced from each other by a word line gap 302, bit lines 306 are spaced from each other by a bit line gap 307, and the phase change memory units are spaced from each other by a unit gap 303.

As shown in the figure, each phase change memory unit in the phase change memory according to the present embodiment comprises: a storage node 305 and a top electrode 308. The storage node 305 comprises a phase change layer that can be made of a GST (germanium, stibium and tellurium) material, for example. The top electrode 308 is provided on top of the storage node 305, with one end thereof being electrically coupled to the storage node 305 and the other end thereof being electrically coupled to the bit line 306. In the phase change memory unit of the present invention, the top electrode 308 is used for heating the storage node 305 such that phase change occurs in the phase change layer. That is to say, when the storage node 305 is written to or reset, current flowing through the top electrode 308 is controlled such that the top electrode 308 is heated, thereby realizing an effect of heating the storage node 305. The phase change layer (which, as above, can be made of a GST material) in the storage node 305 undergoes phase change under the action of heat, and thus the storage node 305 can be written to or reset.

As shown in FIG. 3, in the phase change memory, the phase change memory units 305 in each column (i.e., along one bit line 306) share one linear top electrode 308. In one example, the top electrode 308 is formed integrally with the memory units 305, i.e. connected to its respective memory units 305. Generally, the material of the top electrode is a metal material, such as Ti. Alternatively, a conductive material such as TiN can also be employed to form the top electrode.

The diode 304 is used for ensuring that the current can only flow through the storage node in a one-way direction, so as to store information.

Below, a method of manufacturing a phase change memory according to an embodiment of the present invention will be further described in conjunction with the accompanying drawings.

Figure 4:
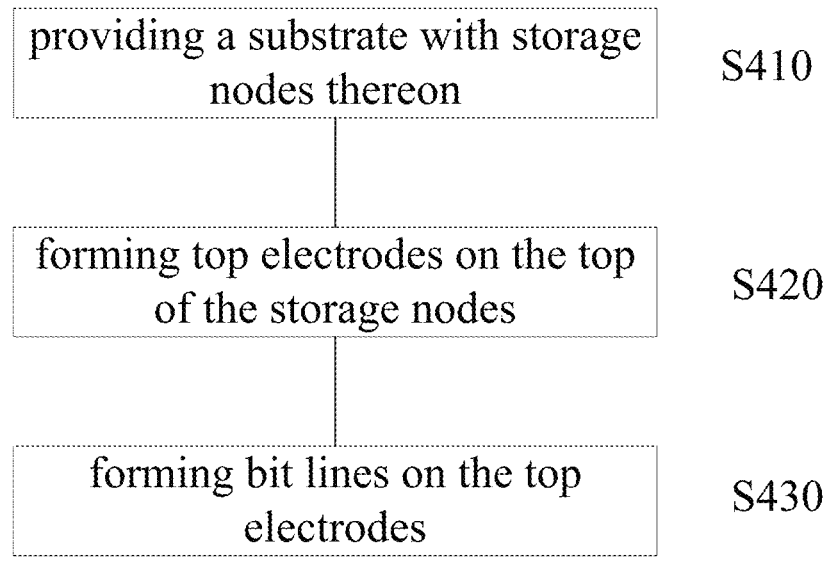
FIG. 4 is a flowchart showing a method for manufacturing a phase change memory according to an embodiment of the present invention.

FIG. 4 is a flowchart of a method for manufacturing a phase change memory according to an embodiment of the present invention.

As shown in the figure, the method for manufacturing a phase change memory of the present invention comprises the following steps:

Firstly, a substrate with storage nodes thereon is provided (step S410). In one embodiment, the storage nodes are provided in the through holes of the substrate. In this substrate, which can be an insulating substrate, a part of the structure of the phase change memory has already been formed. For example, the word lines, the diodes, the storage nodes or the like of the phase change memory have been formed on this substrate in advance. In one example, an array of through holes is provided on the substrate. A p-type semiconductor material and an n-type semiconductor material are filled into each through hole in sequence, thereby forming the diodes which ensure that the current can only pass through in a one-way direction. Then, storage nodes made of a GST material are further formed on the diodes. In addition, the word lines can also be formed in the substrate in advance, and each word line connects a row of through holes. Since the diodes, the word lines and the storage nodes can be formed via known methods, descriptions thereof will not be repeated in the present invention.

Then, the top electrodes are formed on the top of the storage nodes (step S420). The top electrodes play the role of heating the storage nodes such that the phase change material in the storage nodes undergoes phase change, thereby realizing the objective of storing information. In addition, in order to allow current to flow through the top electrode, preferably one end of the top electrode is directly electrically connected to the storage node, such that the heat generated when the current flows through the top electrode can be more quickly transferred to the storage node and the write speed of the phase change memory can be enhanced.

Finally, the bit lines are formed on the top electrodes (step S430) such that the other ends of the top electrodes are directly or indirectly electrically coupled to the bit lines.

The above-described method for manufacturing a phase change memory according to one embodiment of the present invention will now be further described in conjunction with FIGS. 5A to 5J.

Figure 5A:
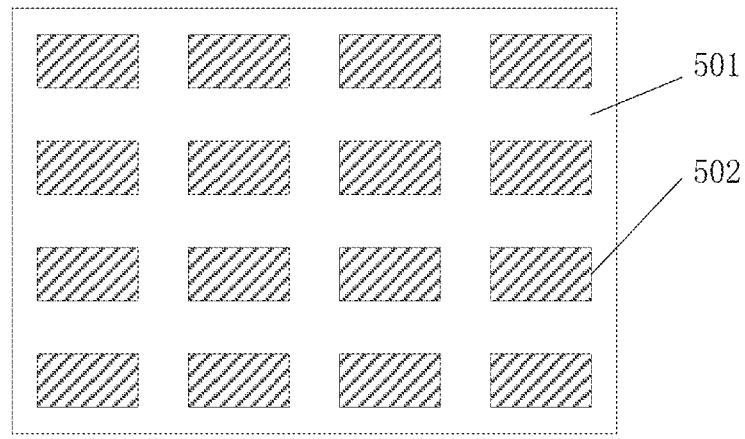
FIGS. 5A~5J are diagrams showing a method for manufacturing a phase change memory according to an embodiment of the present invention.
Figure 5B:
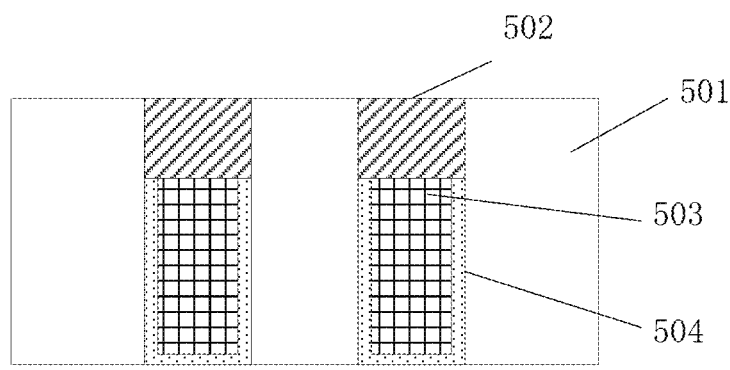

FIGS. 5A and 5B illustrate a substrate 501 according to one embodiment of the present invention. As shown in the plan view of FIG. 5A, an array of storage nodes 502 has already been formed on the substrate 501 in advance.

FIG. 5B illustrates a cross-sectional view of the substrate 501. As shown, storage nodes 502 are located in the through holes of the substrate 501. The substrate 501 is formed of an insulating material such as an oxide. In the through holes, contacts 503 (e.g. made of tungsten (W)) and transitional layers 504 for improving the joint between the contacts 503 and the substrate 501 are provided below the storage nodes 502. Although it is not shown in the figure, one of ordinary skill in the art will understand that the contacts 503 can be further electrically connected to the diode (not shown). That is, the contacts 503 and transitional layers 504 collectively make up the structures shown positioned between diodes 304 and storage nodes 305 in FIG. 3.

On the basis of this substrate 501, the phase change memory according to one embodiment of the present invention is further fabricated.

Next, the top electrodes are formed on the top of the storage nodes 502. In this embodiment, the top electrode of the storage nodes in each column is formed integrally, that is, the storage nodes in each column are connected to one another through the same top electrode.

During the formation of the top electrodes, every two columns of storage nodes are regarded as one group, and a single strip is formed between a first column of storage nodes and a second column of storage nodes of each group. The strip partially overlaps with all the storage nodes in the group. The strip comprises a first sidewall and a second sidewall that are opposite to each other. The first sidewall of the strip is located on the first column of storage nodes, and the second sidewall of the strip is located on the second column of storage nodes. A first top electrode is then formed on the first sidewall, and a second top electrode is formed on the second sidewall.

A particular example of the formation of the top electrodes is as shown in FIGS. 5C to 5G.

Figure 5C:
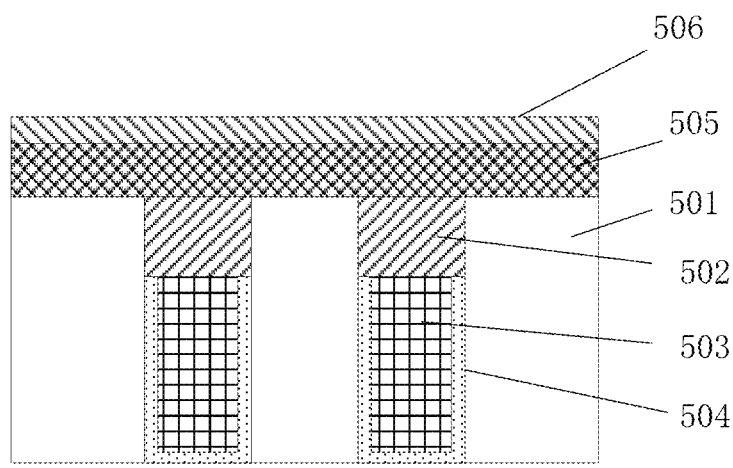

Firstly, as shown in FIG. 5C, a first film layer 505 and a second film layer 506 are formed in order on the substrate 501. The first film layer 505 covers the top surface of the substrate 501 and the top surfaces of the storage nodes 502. The first film layer 505 can be made of a dielectric material such as an oxide, and the second film layer can be a hard mask made of such as a nitride.

Figure 5D:
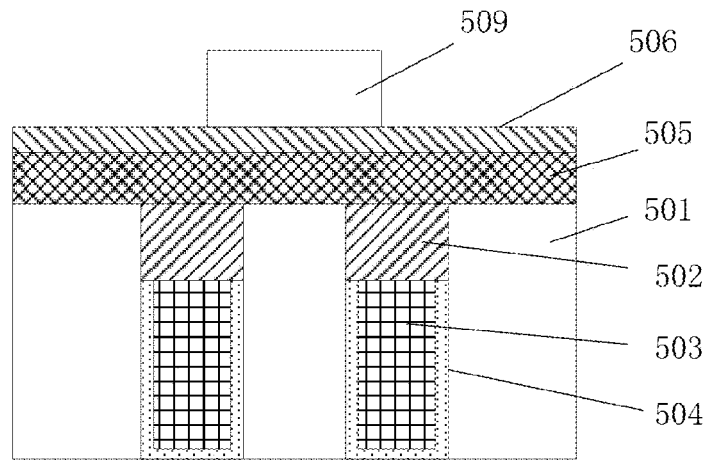

Then, as shown in FIG. 5D, a first mask 509 is formed on the second film layer 506, where the position of the first mask 509 corresponds to the position where a conductive strip is to be formed. The first mask 509 can be formed in known manner from a photo-resist, for example.

Figure 5E:
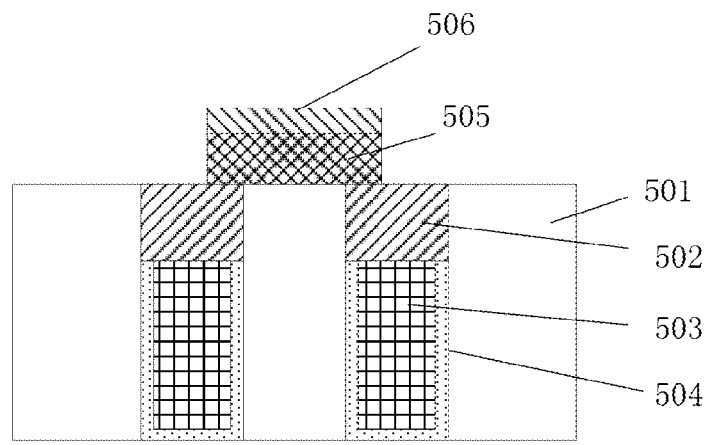

Next, the first film layer 505 and the second film layer 506 are etched. Except for the portion that is protected by the first mask 509, other portions of the first film layer 505 and the second film layer 506 are completely removed. After removing the first mask 509, the structure as shown in FIG. 5E is obtained. As shown in the figure, the remaining portions of the first film layer 505 and the second film layer 506 together constitute a strip, and the two sidewalls of the strip are respectively located over two columns of storage nodes 502.

Figure 5F:
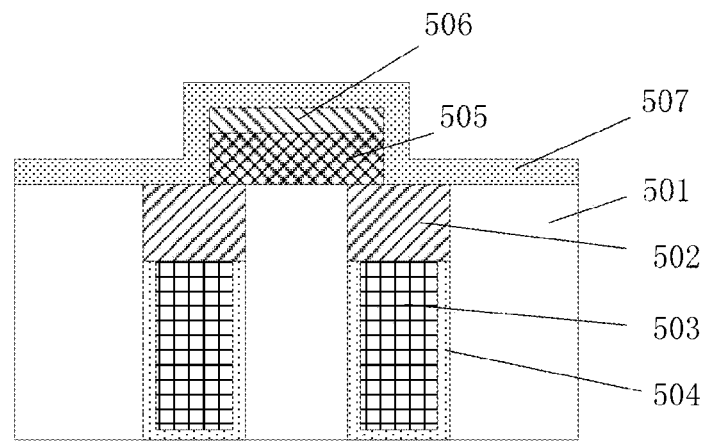

Next, as shown in FIG. 5F, a third film layer 507 is formed on the substrate 501 by, for example, depositing, sputtering, etc. The third film layer 507 covers the surface of the substrate 501, the surface of the second film layer 506, and the two sidewalls and two end surfaces of the strip that is formed by the first film layer 505 and the second film layer 506. Herein, the third film layer is made of a conductive material, which can be any suitable metal, such as TiN or Ti.

Figure 5G:
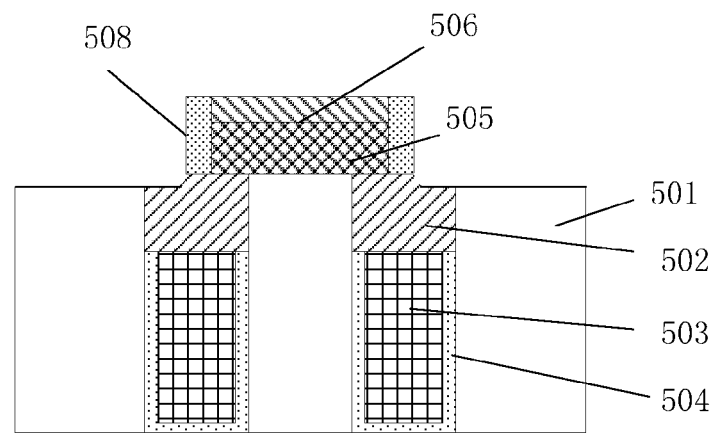

Next, the third film layer 507 is etched, so as to remove the portion of the third film layer 507 that covers the surface of the substrate 501 and the surface of the second film layer 506. In this way, as shown in FIG. 5G, only those portions of the third film layer that are located on the two sidewalls and two end surfaces of the strip remain. The portions of the third film layer remaining on the two sidewalls of the strip form the top electrodes 508.

Figure 5H:
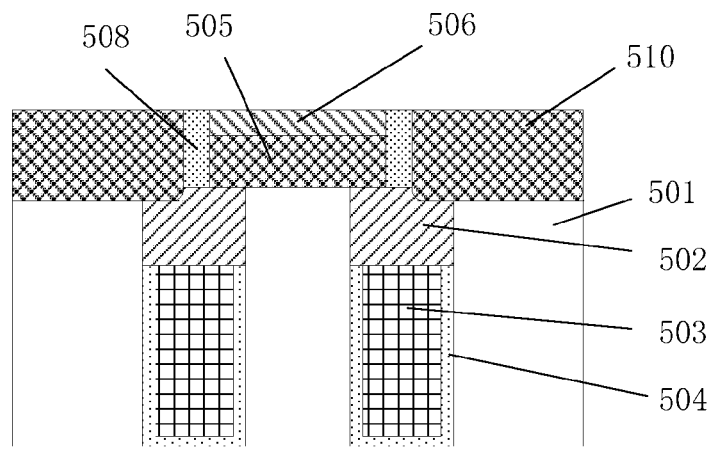

Next, the top electrodes 508 on the two sidewalls are electrically disconnected from each other, which can be accomplished by cutting off or removing both ends of the strip. The two opposite ends of the strip are not shown in FIG. 5G, but can be visualized as the two ends of the strip located at opposite ends of the two columns of storage nodes 502. The cutting process is used when the etching process of FIG. 5G does not remove the two ends of the strip. In one exemplary method of cutting off the two ends of the strip, firstly, a sixth film layer 510 made of a dielectric material is used for covering the entire substrate, that is, the surface of the substrate 501, the surface of the second film layer 506 and the surface of the top electrode 508. Then, a chemical mechanical planarization processing is performed for the sixth film layer 510 with the second film layer 506 as a stop layer. Thus, the structure as shown in FIG. 5H is formed. On the basis of this structure, both ends of the strip are then removed by etching, for example, such that the two top electrodes 508 are electrically disconnected from each other.

Next, the bit lines are formed on the top electrodes 508. Specifically, in this embodiment, the process of forming the bit lines is as shown in FIGS. 5I to 5J.

Figure 5I:
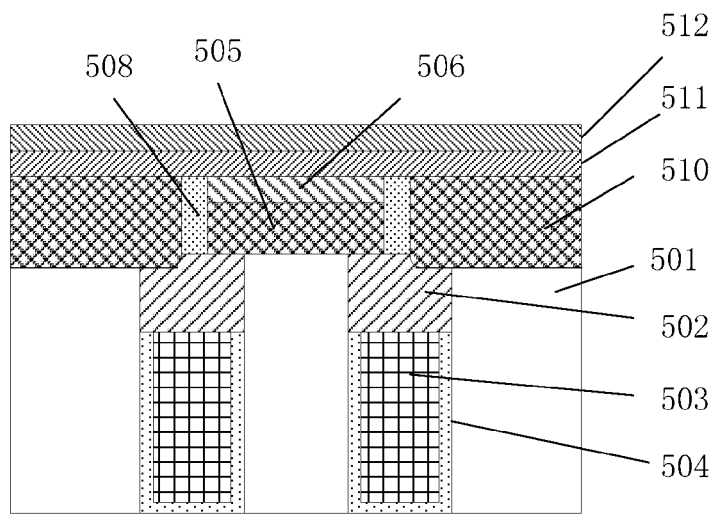
Figure 5J:
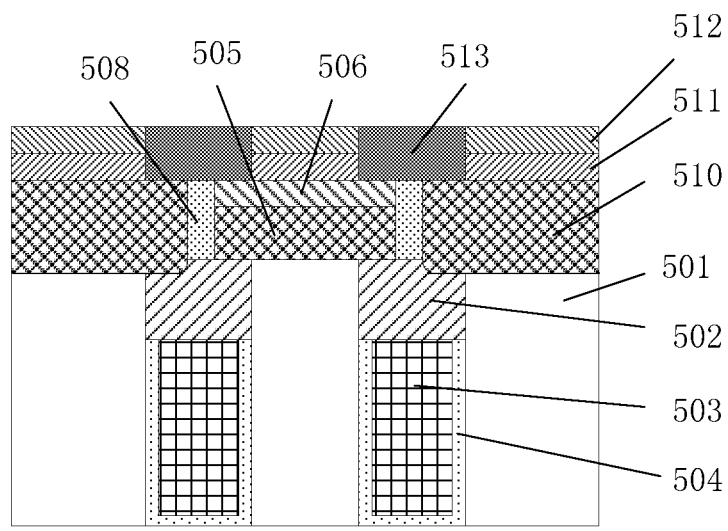

As shown in FIG. 5I, a fourth film layer 511 and a fifth film layer 512 are formed in turn on the entire substrate 501, wherein the fourth film layer 511 is made of a dielectric material such as a nitride, and the fifth film layer 512 is made of a dielectric material such as an oxide.

Finally, trenches are formed on positions in the fourth film layer 511 and the fifth film layer 512 that correspond to the top electrodes 508. These trenches can be formed by etching for example, making the top of the top electrodes 508 exposed from the trenches. A conductive material is filled into the trenches so as to form bit lines 513, as shown in FIG. 5J.

A method of manufacturing a phase change memory according to one embodiment of the present invention has been described above in conjunction with FIGS. 5A~5J. However, one of ordinary skill in the art should understand that the present invention is not strictly limited to the method shown. For example, a chemical mechanical planarization processing can be performed for the fifth film layer 512 before the formation of the bit lines. Moreover, it is not necessary for the bit lines to directly connect to the top electrodes, but a wiring etc. can be employed to make the bit line and the corresponding top electrode indirectly electrically connected.

The semiconductor device according to embodiments of the present invention has the following advantages:

(1) The contact area between the top electrodes and and their respective storage nodes is small, which helps generate heat and is thus helpful for inducing phase change. In particular, as can be seen, the top electrode is bar-shaped, with a width narrower than that of the storage nodes 305 to which it is connected. This narrow width means that the contact area between top electrode and storage node is small (here, smaller than the area of the top of each storage node 305), increasing current density and thus heat.

(2) The top electrodes are linear electrodes, and each top electrode connects one column of storage nodes at the same time. That is, each top electrode connects all storage nodes of a single column to each other. Comparing with the prior art in which each storage node has a separate top electrode, this linear connection can improve photo alignment shift margin and meanwhile ensure that one column of storage nodes has the same shift margin.

(3) Using the sidewalls of a strip to form top electrodes can result in a small CD (critical dimension) line, and in the subsequent processing, the crunodes between the top electrodes and the storage nodes are enwrapped by an oxide, which is desirable in process integration.

(4) The etching of the top electrodes (i.e. the cut off of both ends of the whole strip) can be accomplished by anisotropic etching, which is easier to perform and does not need special etching tools as compared with conventional isotropic etching.

(5) During the formation of the bit lines, the fourth film layer 511 and the fifth film layer 512 are used for filling in the topography caused due to the cut off of the both ends of the strip and the linear top electrode, and meanwhile a gap between bit lines can be formed, and thus additional filling is not needed.

Manufacture of a semiconductor device according to the present invention, as well as the semiconductor device formed thereby, have been described in detail. In order to not obscure the concept of the present invention, some details that are known in the art are not described herein. One of ordinary skill in the art will understand how to implement the technical solution disclosed herein based on the above description.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method of manufacturing a phase change memory, the method comprising:
   providing a substrate with a plurality of through holes, wherein storage nodes each including a phase change layer are formed in the through holes;
   forming a top electrode on each storage node such that one end of the top electrode is electrically connected to more than one of the storage nodes, wherein the top electrode is configured to heat the corresponding electrically connected storage nodes such that their phase change layers undergo a phase change; and
   forming bit lines on the top electrodes such that another end of the top electrode is electrically coupled to a corresponding bit line.

2. The method of claim 1, wherein the storage nodes are arranged in at least one column, and the top electrode is electrically connected to each of the storage nodes of the at least one column.

3. The method of claim 2, wherein the forming a top electrode further comprises:
   by taking every two columns of storage nodes as one group, forming a single strip of material between a first column and a second column of each group, wherein the strip at least partially overlaps each of the storage nodes in the respective group, each strip comprising a first sidewall and a second sidewall that are positioned opposite to each other, the first sidewall being located on the respective first column, and the second sidewall being located on the respective second column; and
   forming a first top electrode on the first sidewall and a second top electrode on the second sidewall.

4. The method of claim 3, wherein, the forming a single strip further comprises:
   forming a first film layer on the substrate;

forming a second film layer on the first film layer;

forming a first mask on the second film layer, wherein a position of the first mask corresponds to a position of the strip;

etching the first film layer and the second film layer; and removing the first mask.

5. The method of claim 4, wherein the first film layer comprises a dielectric material.

6. The method of claim 5, wherein the dielectric material comprises an oxide.

7. The method of claim 4, wherein the first mask comprises a photo-resist.

8. The method of claim 4, wherein the second film layer comprises a hard mask layer.

9. The method of claim 8, wherein the hard mask layer further comprises a nitride.

10. The method of claim 3, wherein the forming a first top electrode on the first sidewall and a second top electrode on the second sidewall further comprises:

after the forming a single strip, forming a third film layer on the substrate so as to cover a surface of the strip, the first sidewall, the second sidewall and a surface of the substrate; and etching the third film layer to remove a portion of the third film layer that covers the surface of the strip and the surface of the substrate.

11. The method of claim 10, wherein the third film layer comprises a conductive material.

12. The method claim 11, wherein the conductive material comprises a metal material.

13. The method of claim 10, wherein the third film layer comprises Ti or TiN.

14. The method claim 10, wherein the forming a first top electrode on the first sidewall and a second top electrode on the second sidewall further comprises:

forming a sixth film layer on the substrate, so as to cover a surface of the substrate, a surface of the strip and surfaces of the first top electrode and the second top electrode;

performing a chemical mechanical planarization processing on the substrate using second film layer as a stop layer; and removing ends of the strip such that the first top electrode and the second top electrode are electrically disconnected from each other.

15. The method of claim 14, wherein the removing ends of the strip further comprises:

etching the sixth film layer, the second film layer and the third film layer.

16. The method of claim 14, wherein the forming bit lines further comprises:

after the removing ends of the strip, forming a fourth film layer and a fifth film layer in order on the substrate;

forming a first trench and a second trench in the fourth film layer and the fifth film layer, the first and second trenches formed in positions that correspond to the first top electrode and the second top electrode respectively; and filling a conductive material into said first trench and said second trench, so as to form the bit lines.

17. The method of claim 16, wherein the fourth film layer comprises a nitride.

18. The method of claim 16, wherein the fifth film layer comprises an oxide.

19. The method of claim 14, wherein the sixth film layer comprises a dielectric material.

20. The method of claim 1, wherein the forming a top electrode further comprises forming the top electrode so as to contact upper surfaces of the more than one of the storage nodes, and wherein an area of contact between the top electrode and the respective upper surface of each storage node is smaller than the respective upper surface of each storage node.

* * * * *